(12) United States Patent
Reist et al.

(10) Patent No.: US 9,482,704 B2
(45) Date of Patent: Nov. 1, 2016

(54) DETECTING SHORTED DIODES

(71) Applicant: ABB Technology AG, Zürich (CH)

(72) Inventors: Samuel Reist, Dietikon (CH); Manuel Vetterli, Basel (CH); Matthias Lüscher, Gontenschwil (CH); Juerg Rauchenstein, Lachen (CH)

(73) Assignee: ABB Schweiz AG, Baden (CH)

( * ) Notice: Subject to any disclaimer, the term of this patent is extended or adjusted under 35 U.S.C. 154(b) by 168 days.

(21) Appl. No.: 14/550,200

(22) Filed: Nov. 21, 2014

(65) Prior Publication Data

US 2015/0153396 A1 Jun. 4, 2015

(30) Foreign Application Priority Data

Dec. 2, 2013 (EP) ..................................... 13195304

(51) Int. Cl.
*G01R 31/02* (2006.01)
*G01R 25/00* (2006.01)
*G01R 31/26* (2014.01)

(52) U.S. Cl.
CPC ............ *G01R 25/00* (2013.01); *G01R 31/2632* (2013.01)

(58) Field of Classification Search
CPC ...... G01R 31/40; G01R 31/42; G01R 31/34; G01R 31/343; G01R 31/346; G01R 31/2632; G01R 31/2633; G01R 31/2635
See application file for complete search history.

(56) References Cited

U.S. PATENT DOCUMENTS

| | | | | |
|---|---|---|---|---|
| 5,206,801 A | * | 4/1993 | Flick | H02H 7/1255 363/126 |
| 8,242,726 B2 | * | 8/2012 | Kanyo | H02M 1/34 318/400.08 |
| 9,197,125 B2 | * | 11/2015 | Bachmaier | H02M 7/125 |
| 2011/0216449 A1 | | 9/2011 | Reschovsky et al. | |

OTHER PUBLICATIONS

European Search Report mailed on May 13, 2014, for European Application No. 13195304.4.
Mariana Iorgulescu, Study of Three-Phase Bridge Rectifier Diagnosis based on Output Voltage and Current Analysis, 2013 $8^{th}$ International Symposium on Advanced Topics in Electrical Engineering, May 23, 2013, pp. 1-6.

* cited by examiner

*Primary Examiner* — Tung X Nguyen
(74) *Attorney, Agent, or Firm* — Taft Stettinius & Hollister LLP

(57) ABSTRACT

A method, a controller unit for a bridge rectifier, and a bridge rectifier system are disclosed for detecting a shorted diode in a bridge rectifier. The method can include determining a phase-to-phase voltage between two phase inputs of the bridge rectifier, wherein a phase input is provided between the two series connected diodes of the respective phase, and indicating a shorted diode fault by determining whether the phase-to-phase voltage is zero for more than a commutation time of the bridge rectifier.

20 Claims, 2 Drawing Sheets

US 9,482,704 B2

DETECTING SHORTED DIODES

RELATED APPLICATION(S)

This application claims priority under 35 U.S.C. §119 to European Patent Application No. 13195304.4 filed in Europe on Dec. 2, 2013, the entire content of which is hereby incorporated by reference in its entirety.

FIELD

The disclosure relates to a method and a controller unit for detecting a shorted diode in a bridge rectifier, and a bridge rectifier system.

BACKGROUND INFORMATION

Three-phase bridge rectifiers or diode bridges can include three series-connected pairs of diodes connected in parallel, which interconnect a three-phase AC voltage source with a DC load.

A functioning diode can have a very low resistance in one (conducting) direction of current flow and a very high resistance in the other (blocking) direction. As any electronic components, diodes can be subjected to wear and sometimes can become faulty. A common fault can be a so-called shorted diode, in which the very high resistance in blocking direction degrades and the diode conducts in both directions.

Because a shorted diode fault can lead to high currents in the bridge rectifier and the connected equipment, after a detected shorted diode fault, the input current and/or the output current of the bridge rectifier can be quickly shut down so that a detection of such a fault can be made.

For example, in US 2011/0216449 A1, the voltage across a pair of diodes can be measured to determine a ratio between the individual diode voltages. This ratio can be analyzed, to determine whether one of the diodes has a fault.

SUMMARY

A method for detecting a shorted diode in a bridge rectifier having two series-connected diodes for each phase of the bridge rectifier is disclosed, the method comprising: determining a phase-to-phase voltage ($V_{ab}$, $V_{bc}$, $V_{ca}$) between two phase inputs of the bridge rectifier; providing a phase input between the two series-connected diodes of each respective phase; determining whether the phase-to-phase voltage is zero for more than a commutation time of the bridge rectifier; and indicating a shorted diode fault when the phase-to-phase voltage is zero for more than the commutation time of the bridge rectifier.

A controller unit for a bridge rectifier, wherein the controller unit stores a computer program in a non-transitory medium for causing the controller unit to execute a method for detecting a shorted diode in a bridge rectifier having two series-connected diodes for each phase of the bridge rectifier is disclosed, the method comprising: determining a phase-to-phase voltage ($V_{ab}$, $V_{bc}$, $V_{ca}$) between two phase inputs of the bridge rectifier; providing a phase input between the two series-connected diodes of each respective phase; determining whether the phase-to-phase voltage is zero for more than a commutation time of the bridge rectifier; and indicating a shorted diode fault when the phase-to-phase voltage is zero for more than the commutation time of the bridge rectifier.

A bridge rectifier system is disclosed, comprising: a bridge rectifier with two series connected diodes for each phase providing a phase input between them, wherein the series connected diodes for each phase are connected in parallel to an DC output of the bridge rectifier; and a controller unit, which stores a computer program in a non-transitory medium for causing the controller unit to execute a method for detecting a shorted diode in a bridge rectifier having two series-connected diodes for each phase of the bridge rectifier, the method including: determining a phase-to-phase voltage ($V_{ab}$, $V_{bc}$, $V_{ca}$) between two phase inputs of the bridge rectifier; providing a phase input between the two series-connected diodes of the respective phase; determining whether the phase-to-phase voltage is zero for more than a commutation time of the bridge rectifier; and indicating a shorted diode fault when the phase-to-phase voltage is zero for more than the commutation time of the bridge rectifier.

BRIEF DESCRIPTION OF THE DRAWINGS

The disclosure is explained below with reference to the exemplary embodiments shown in the drawings. In the drawings.

DETAILED DESCRIPTION

Figure 1:
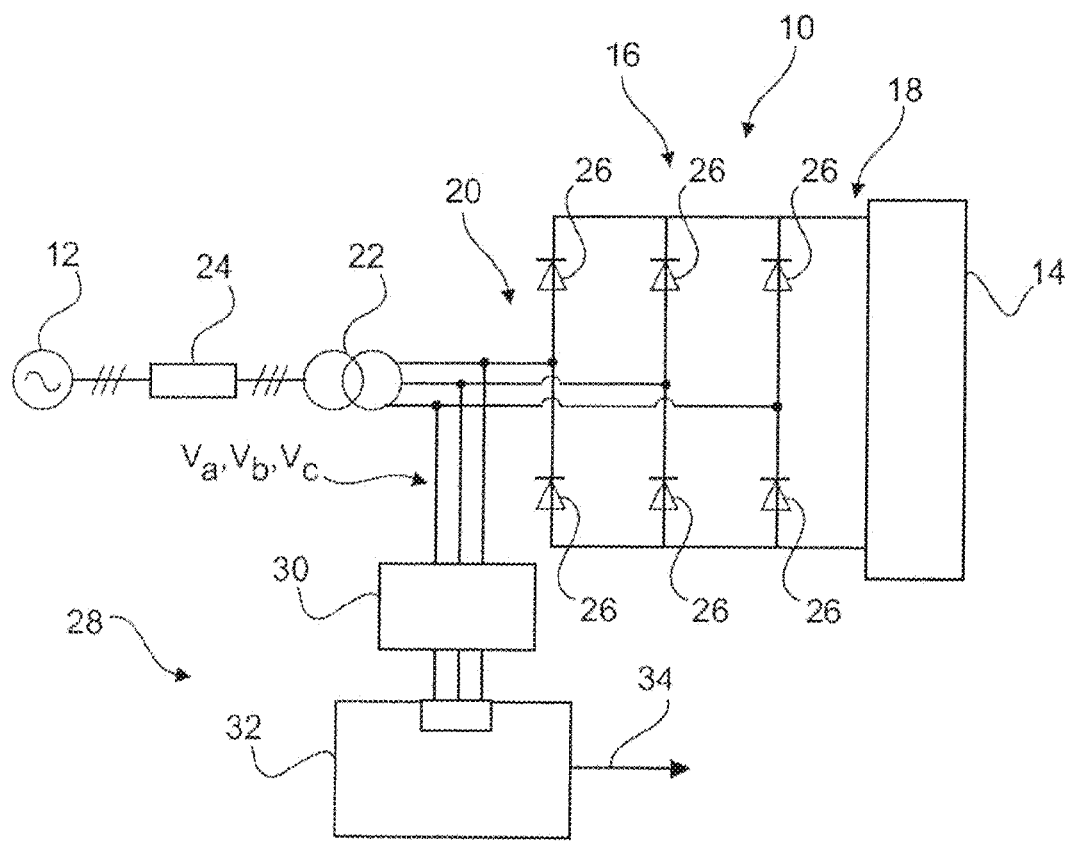
FIG. 1 schematically shows a circuit diagram of a bridge rectifier system according to an exemplary embodiment of the disclosure.

In accordance with an exemplary embodiment, the disclosure relates to detecting a diode fault in a fast, reliable and simple way.

In accordance with an exemplary embodiment, the disclosure relates to a method for detecting a shorted diode in a bridge rectifier or diode bridge, which, for example, can be a medium voltage bridge rectifier. For example, as disclosed, a shorted diode can be a diode that can be conducting in both directions.

In accordance with an exemplary embodiment, a bridge rectifier can include two series-connected diodes for each phase of the bridge rectifier. A phase input can be provided between each pair of series-connected diodes. The pairs of series-connected diodes can be connected in parallel to provide a DC output of the bridge rectifier. For example, the bridge rectifier can be of 6-pulse type (with three pairs of diodes) and any combination thereof (for example, of 12-pulse type, 24-pulse type, 36-pulse type, etc.).

In accordance with an exemplary embodiment, the method can include the steps of: determining a phase-to-phase voltage between two phase inputs of the bridge rectifier, wherein a phase input can be provided between the two series-connected diodes of the respective phase; and indicating a shorted diode fault by determining whether the phase-to-phase voltage zero for more than a commutation time of the bridge rectifier. In accordance with an exemplary embodiment, all phase-to-phase voltages between the phase inputs can be determined.

In normal operation, for example, no fault, the phase-to-phase voltages at the phase inputs remain close to zero voltage (for example, below a certain threshold) when the corresponding diodes are commutating. For example, when a first phase voltage is becoming higher than a second phase voltage, the corresponding first diode can be still conducting, while the corresponding second diode starts to conduct. During this time, the rectifier can be shorting the phases. Phase inductors connected to the phase inputs (such as transformer windings) can maintain a short-circuit current for a finite commutation time. This commutation time can be specific for a given rectifier system and does not exceed a certain worst-case value in normal operation.

In case of a diode fault (shorting), the bridge rectifier can also generate a short on input phases. However, in this situation, the short can persist longer than the commutation time. The corresponding phase-to-phase voltage can be close to zero for a time that can be longer than the worst case commutation time for the given rectifier system. The method can use this corresponding phase-to-phase voltage to detect a diode fault. For example, in the case where a zero or nearly zero phase-to-phase voltage can be detected or determined for a time longer than the worst case commutation time, a diode fault can be detected and/or a diode fault output signal can be generated.

According to an exemplary embodiment of the disclosure, the phase-to-phase voltage can be determined by the steps of: measuring a first phase voltage at a first phase input of the bridge rectifier; measuring a second phase voltage of a second phase input of the bridge rectifier; and calculating the phase-to-phase voltage as the difference between the first phase voltage and the second phase voltage. For example, the (for example, three) phase voltages can be measured with respect to the same reference. In accordance with an exemplary embodiment, the phase-to-phase voltages can be calculated from differences of these phase voltages.

According to an exemplary embodiment of the disclosure, it can be determined, whether the phase-to-phase voltage can be zero, when the absolute value of the phase-to-phase voltage can be smaller than a predefined voltage threshold value. For example, in a medium voltage system, the magnitude of the phase voltages can range between, for example, zero and more than 1000 V (and therefore the phase-to-phase voltages can be more than 2000 V). For example, in this case, a phase-to-phase voltage below, for example, 100 V, such as 80 V can indicate a (nearly) zero voltage. In accordance with an exemplary embodiment, for example, the voltage threshold value can be smaller than, for example, about 10% of a maximal phase voltage at a phase input of the bridge rectifier.

According to an exemplary embodiment of the disclosure, it can be determined, whether the phase-to-phase voltage can be, for example, zero for more than a commutation time of the bridge rectifier, when a time, during which the phase-to-phase voltage can be zero, can be longer than a predefined time threshold value (for example, a worst case commutation time). For example, when the phase voltages have a frequency of, for example, 50 Hz or 60 Hz, the commutation time can be, for example, about 2 ms. In this case, the time threshold value can be, for example, about 3 ms. In accordance with an exemplary embodiment, for example, the time threshold value can be smaller than, for example, 20% of the period of an AC voltage at a phase input of the bridge rectifier.

According to an exemplary embodiment of the disclosure, the bridge rectifier can have at least three phase inputs, and at least three phase-to-phase voltages can be determined between the at least three phase inputs of the rectifier. As disclosed, for example, the bridge rectifier can be a 12-pulse rectifier.

According to an exemplary embodiment of the disclosure, the method can include the steps of: determining, whether a circuit breaker connected to the phase inputs can be open; and only indicating a shorted diode, when the circuit breaker can be closed (for example, not open). Additionally, the state of a circuit breaker can be detected to mask a fault signal when the circuit breaker can be open. Otherwise, for example, the vanishing voltages at the opening of the circuit breaker can be interpreted as diode fault.

In accordance with an exemplary embodiment, since in reaction to a diode fault, the outputs of the bridge rectifier can be short-circuited, which can result in high energy losses and strong wear of the components of the rectifier system, the masking of not correctly detected diode faults can result in smaller losses and a longer lifetime of the system.

According to an exemplary embodiment of the disclosure, it can be determined that the circuit breaker can be open by determining that the absolute value of at least two or all phase-to-phase voltages can be zero or smaller than a predefined threshold voltage. The state (such as opened or closed) of the circuit breaker can be determined based on the same voltage measurements, which can be used for the diode fault determination.

According to an exemplary embodiment of the disclosure, a controller unit for a bridge rectifier is disclosed, wherein the controller unit can be adapted for executing the steps of the method as disclosed herein. The controller unit can be a part or a sub-module of a controller of the rectifier system. For example, the method can be implemented in hardware or in software executed in a processor of the controller unit.

According to an exemplary embodiment of the disclosure, the controller unit can include an FPGA (Field Programmable Gate Array). The control method can also be implemented in an FPGA. For example, the control unit can comprise a voltage measurement board, which can allow measuring the medium voltages at the phase input of the bridge rectifier and/or can include an FPGA board, which can process the measured values in order to detect a diode fault.

According to an exemplary embodiment, the disclosure relates to a bridge rectifier system, which can include a bridge rectifier with two series-connected diodes for each phase, providing a phase input between them, wherein the series-connected diodes for each phase are connected in parallel to a DC output of the bridge rectifier; and a controller unit as disclosed herein. In the case of a bridge rectifier with higher pulse order (12-pulse, 24-pulse, etc.), the method can be applied for each three-phase rectifier of the complete bridge rectifier individually. The diodes can be medium voltage diodes.

According to an exemplary embodiment of the disclosure, the bridge rectifier system can include a transformer interconnecting the phase inputs of the bridge rectifier with a voltage source. The controller unit can be adapted to measure a phase voltage at a phase input of the bridge rectifier between the transformer and the phase input. In accordance with an exemplary embodiment, the method can be applied for rectifier systems that do not have a transformer but are directly connected to the power grid.

According to an exemplary embodiment of the disclosure, the bridge rectifier system can include a circuit breaker adapted for disconnecting a voltage source from the bridge rectifier. The circuit breaker can connect a power grid as voltage source to the transformer, which can then feed the bridge rectifier.

Accordingly to an exemplary embodiment of the disclosure, the features of the method as disclosed herein can be features of the controller unit and/or bridge rectifier system as disclosed.

FIG. 1 shows a rectifier system 10 that can connect a power source (power grid) 12 providing a multi-phase AC voltage with a DC load 14. The rectifier system 10 can include a bridge rectifier 16 with a DC output 18 and three phase inputs 20 connected with a transformer 22 that can be supplied from the power source 12 via a circuit breaker 24.

The bridge rectifier 16 can include three pairs of diodes 26 that can be connected in parallel with the DC output 18. The two diodes 26 of each pair of diodes 26 can be connected in series and provide one of the AC phase inputs 20 between them. The shown bridge rectifier 16 can be a 6-pulse rectifier. For example, corresponding 12-, 24- or 36-pulse rectifiers would have 6, 12 . . . phase inputs and pairs of diodes.

For example, to increase the voltage strength of the rectifier 16, each single diode 26 can be replaced by a series connection of two or more diodes (for example, a six pulse rectifier would then have four diodes per phase leg, and 12 diodes in total).

A controller unit 28 of the rectifier system 10 can include a voltage measurement board 30 that can be adapted for measuring the phase voltages $V_a$, $V_b$, $V_c$ at the phase inputs 20, and a further fault detection board 32 that can be adapted for evaluating the measured phase voltages and for providing a fault indication signal 34, in the case a diode fault can be detected.

Figure 2:
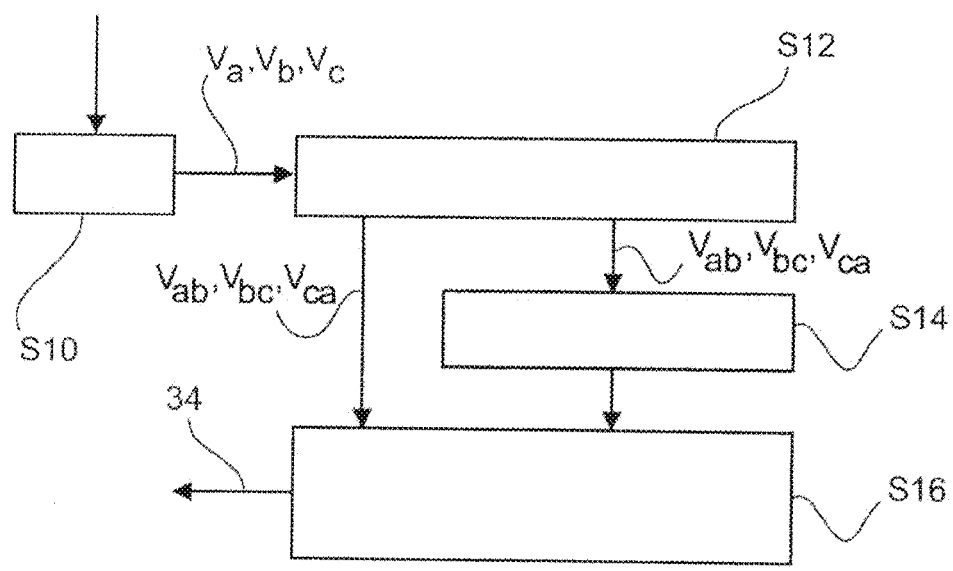
FIG. 2 shows a flow diagram for a method for detecting a shorted diode according to an exemplary embodiment of the disclosure.

For example, the fault detection board 32 can be based on an FPGA that receives the digitized measured phase voltage values and processes them as described with respect to FIG. 2.

FIG. 2 shows a flow diagram, for a method for detecting a shorted diode 26 of the rectifier 16 that can be performed by the controller unit 28.

In step S10, the phase voltages $V_a$, $V_b$, $V_c$ are measured with respect to a common reference (such as the ground potential) and digitized by the voltage measurement board 30. The measured phase voltages $V_a$, $V_b$, $V_c$ are then input to the fault detection board 32, which performs the following steps S12 to S16.

In step S12, the phase-to-phase voltages $V_{ab}$, $V_{bc}$, $V_{ca}$ between the phase inputs 20 can be calculated as the differences between the phase voltages $V_a$, $V_b$, $V_c$.

In step S14, it can be determined, whether the circuit breaker 22 can be open. The phase-to-phase voltages $V_{ab}$, $V_{bc}$, $V_{ca}$ can be compared to a voltage threshold value. In the case where the absolute value of the all three phase-to-phase voltages $V_{ab}$, $V_{bc}$, $V_{ca}$ are smaller than the voltage threshold value, it can be assumed that the circuit breaker can be open.

In the case where it has been determined in step S14 that the circuit breaker can be open, the fault detection board 32 determines in step S16, whether a phase-to-phase voltage $V_{ab}$, $V_{bc}$, $V_{ca}$ can be zero for more than a worst case commutation time of the bridge rectifier.

First, the phase-to-phase voltages $V_{ab}$, $V_{bc}$, $V_{ca}$ are compared to a voltage threshold value (which can be the same or a different value as the one used in step S14) to determine if one of these voltages can be zero, when the absolute value of the corresponding voltage can be smaller than the voltage threshold value.

If one of the phase-to-phase voltages $V_{ab}$, $V_{bc}$, $V_{ca}$ can be considered to be zero, the time for which this voltage can be zero is determined. For example, the steps of the method can be repeated regularly for every time step, and a counter for the respective phase-to-phase voltages $V_{ab}$, $V_{bc}$, $V_{ca}$ can be incremented, in the case where the voltage can be zero. The corresponding time then can be calculated as the duration of the time step times the counter.

If the time during which the phase-to-phase-voltage $V_{ab}$, $V_{bc}$, $V_{ca}$ is zero can be longer than a time threshold value (longer than a worst-case commutation time), then it can be assumed that a diode 26 has shorted and a corresponding fault signal 34 is output.

Figure 3:
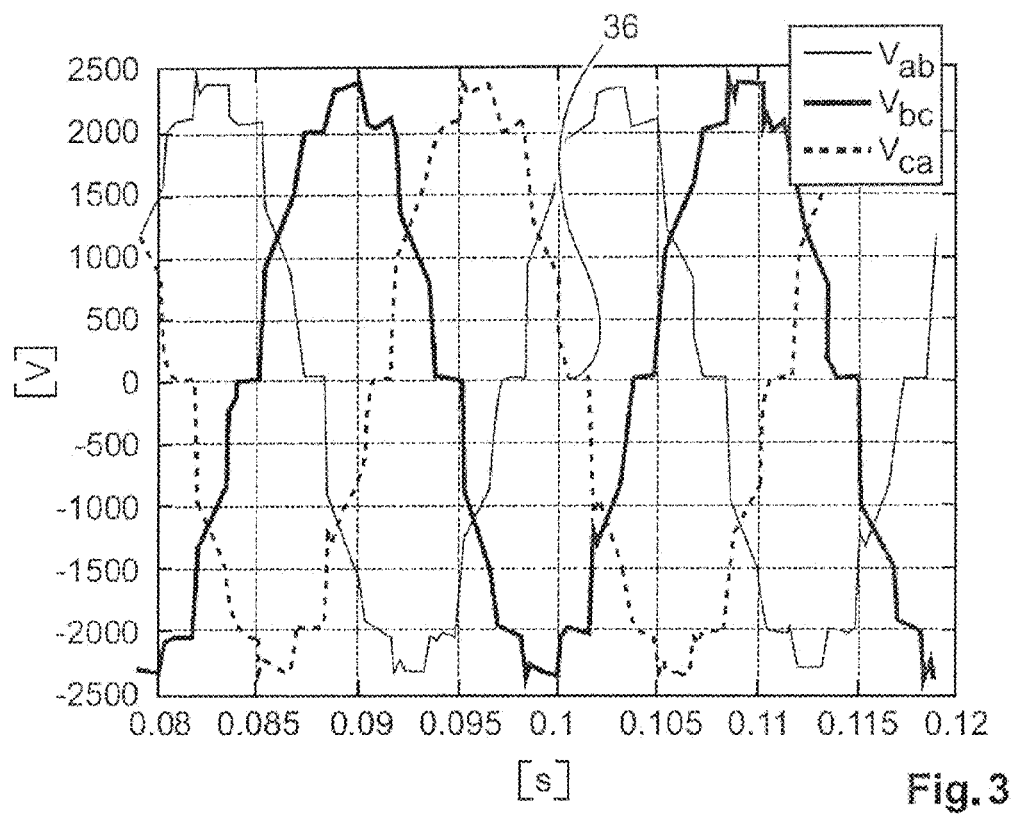
FIG. 3 shows a diagram with phase-to-phase voltages during normal operation of the system of FIG. 1.

As an example, FIG. 3 shows a diagram with three phase-to-phase-voltages $V_{ab}$, $V_{bc}$, $V_{ca}$ during a normal operation of the bridge rectifier 16. The commutation times 36 of the diodes 16, for example, can be always about 2 ms.

Figure 4:
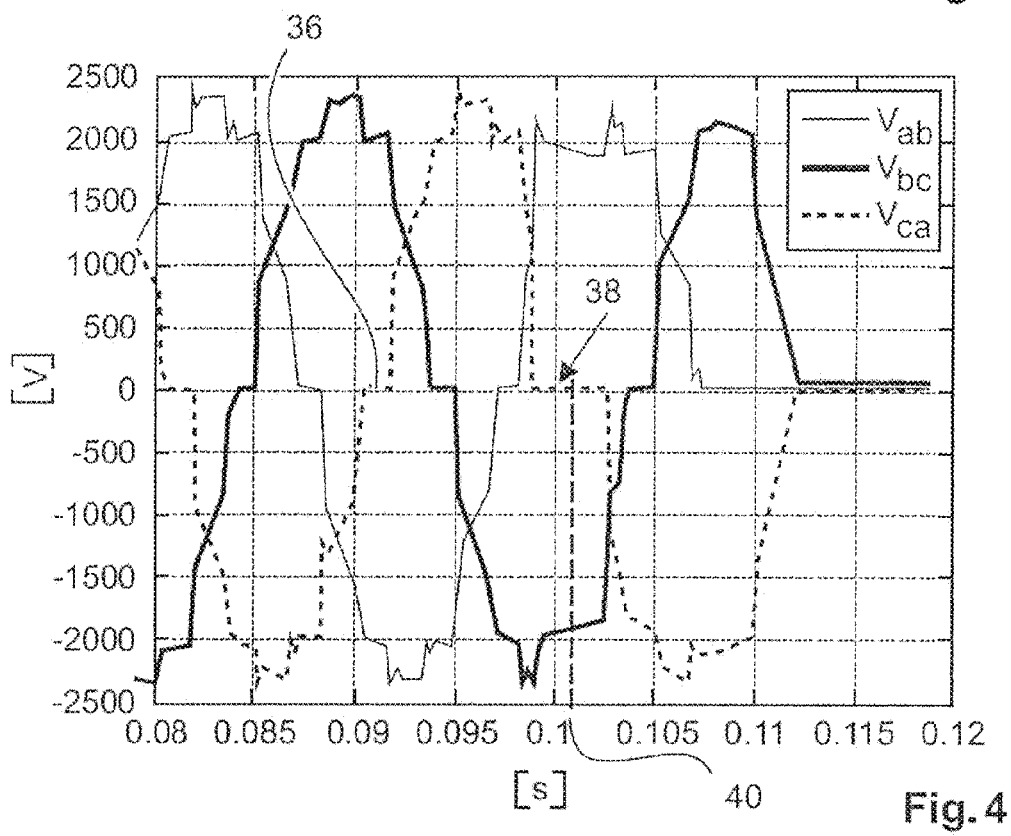
FIG. 4 shows a diagram with phase-to-phase voltages during faulty operation of the system of FIG. 1.

FIG. 4 shows a corresponding diagram, in which a diode shorting occurred at 0.1 s. The time 38, where the phase-to-phase voltage $V_{ca}$ is nearly zero can be much longer than the commutation time 36. Thus, already at time point 40 the method can indicate a diode fault.

While the disclosure has been illustrated and described in detail in the drawings and foregoing description, such illustration and description are to be considered illustrative or exemplary and not restrictive; the disclosure is not limited to the disclosed embodiments. Other variations to the disclosed embodiments can be understood and effected by those skilled in the art and practising the claimed disclosure, from a study of the drawings, the disclosure, and the appended claims. In the claims, the word "comprising" does not exclude other elements or steps, and the indefinite article "a" or "an" does not exclude a plurality. A single processor or controller or other unit can fulfil the functions of several items recited in the claims. The mere fact that certain measures are recited in mutually different dependent claims does not indicate that a combination of these measures cannot be used to advantage. Any reference signs in the claims should not be construed as limiting the scope.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE SYMBOLS 10 rectifier system
12 power source
14 load
16 bridge rectifier
18 DC output
20 AC phase input
22 transformer
24 circuit breaker
26 diode
28 controller unit
$V_a$, $V_b$, $V_c$ phase voltage
30 voltage measurement board
32 fault detection board
34 fault indication signal
Vab, Vbc, Vca phase-to-phase voltage
36 commutation time 38 diode shorting time
40 fault indication time

What is claimed is:

1. A method for detecting a shorted diode in a bridge rectifier having two series-connected diodes for each phase of the bridge rectifier, the method comprising:
   determining a phase-to-phase voltage ($V_{ab}$, $V_{bc}$, $V_{ca}$) between two phase inputs of the bridge rectifier;
   providing a phase input between the two series-connected diodes of each respective phase;
   determining whether the phase-to-phase voltage is zero for more than a commutation time of the bridge rectifier; and
   indicating a shorted diode fault when the phase-to-phase voltage is zero for more than the commutation time of the bridge rectifier.

2. The method of claim 1, wherein the phase-to-phase voltage is determined by:
   measuring a first phase voltage at a first phase input of the bridge rectifier;
   measuring a second phase voltage of a second phase input of the bridge rectifier; and
   calculating the phase-to-phase voltage as a difference between the first phase voltage and the second phase voltage.

3. The method of claim 1, comprising:
   determining that the phase-to-phase voltage is zero when the phase-to-phase voltage is smaller than a predefined voltage threshold value.

4. The method of claim 3, wherein the predefined voltage threshold value is smaller than about 10% of a maximal phase voltage at a phase input of the bridge rectifier.

5. The method of claim 1, comprising:
   determining that the phase-to-phase voltage is zero for more than a commutation time of the bridge rectifier by determining that a time, during which the phase-to-phase voltage is zero, is longer than a predefined time threshold value.

6. The method of claim 5, wherein the predefined time threshold value is smaller than about 20% of a period of an AC voltage at a phase input of the bridge rectifier.

7. The method of claim 1, wherein the bridge rectifier comprises:
   at least three phase inputs; and
   at least three phase-to-phase voltages are determined between the at least three phase inputs of the rectifier.

8. The method of claim 7, comprising:
   determining whether a circuit breaker connected to the phase inputs is open; and
   only indicating a shorted diode, when the circuit breaker is closed.

9. The method of claim 8, comprising:
   determining that the circuit breaker is open by determining that the three phase-to-phase voltages are smaller than a predefined threshold voltage.

10. The method of claim 1, comprising:
    determining whether a circuit breaker connected to the phase inputs is open; and
    only indicating a shorted diode, when the circuit breaker is closed.

11. A controller unit for a bridge rectifier, wherein the controller unit stores a computer program in a non-transitory medium for causing the controller unit to execute a method for detecting a shorted diode in a bridge rectifier having two series-connected diodes for each phase of the bridge rectifier, the method comprising:
    determining a phase-to-phase voltage ($V_{ab}$, $V_{bc}$, $V_{ca}$) between two phase inputs of the bridge rectifier;
    providing a phase input between the two series-connected diodes of each respective phase;
    determining whether the phase-to-phase voltage is zero for more than a commutation time of the bridge rectifier; and
    indicating a shorted diode fault when the phase-to-phase voltage is zero for more than the commutation time of the bridge rectifier.

12. The controller unit of claim 11, wherein the phase-to-phase voltage is determined by:
    measuring a first phase voltage at a first phase input of the bridge rectifier;
    measuring a second phase voltage of a second phase input of the bridge rectifier; and
    calculating the phase-to-phase voltage as a difference between the first phase voltage and the second phase voltage.

13. The controller unit of claim 11, wherein the controller is programmed for determining that the phase-to-phase voltage is zero when the phase-to-phase voltage is smaller than a predefined voltage threshold value.

14. The controller unit of claim 11, comprising:
    a FPGA (Field Programmable Gate Array) for executing at least a portion of the method.

15. The controller unit of claim 14, wherein the method is executed by a FPGA.

16. A bridge rectifier system, comprising:
    a bridge rectifier with two series connected diodes for each phase providing a phase input between them, wherein the series connected diodes for each phase are connected in parallel to an DC output of the bridge rectifier; and
    a controller unit, which stores a computer program in a non-transitory medium for causing the controller unit to execute a method for detecting a shorted diode in a bridge rectifier having two series-connected diodes for each phase of the bridge rectifier, the method including:
    determining a phase-to-phase voltage ($V_{ab}$, $V_{bc}$, $V_{ca}$) between two phase inputs of the bridge rectifier;
    providing a phase input between the two series-connected diodes of the respective phase;
    determining whether the phase-to-phase voltage is zero for more than a commutation time of the bridge rectifier; and
    indicating a shorted diode fault when the phase-to-phase voltage is zero for more than the commutation time of the bridge rectifier.

17. The bridge rectifier system of claim 16, comprising:
    a transformer interconnecting the phase inputs of the bridge rectifier with a voltage source; and
    wherein the controller unit is configured with a computer program to measure a phase voltage at a phase input of the bridge rectifier between the transformer and the phase input.

18. The bridge rectifier system of claim 16, comprising:
    a circuit breaker connected for disconnecting a voltage source from the bridge rectifier.

19. The bridge rectifier system of claim 16, wherein the diodes are medium voltage diodes.

20. The bridge rectifier system of claim 16, wherein the controller is programmed for determining phase-to-phase voltage by:
    measuring a first phase voltage at a first phase input of the bridge rectifier;

measuring a second phase voltage of a second phase input of the bridge rectifier; and calculating the phase-to-phase voltage as a difference between the first phase voltage and the second phase voltage.

* * * * *